United States Patent [19]

Noguchi

[11] Patent Number: 4,841,346
[45] Date of Patent: Jun. 20, 1989

[54] FIELD-EFFECT TRANSISTOR DEVICES

[75] Inventor: Tatsuo Noguchi, Yokohama, Japan

[73] Assignee: Kabushiki Kaisha Toshiba, Kawasaki, Japan

[21] Appl. No.: 28,627

[22] Filed: Mar. 20, 1987

[30] Foreign Application Priority Data

Mar. 22, 1986 [JP] Japan ................... 61-64406

[51] Int. Cl.⁴ .......................... H01L 29/78
[52] U.S. Cl. .................. 357/23.1; 357/23.3; 357/23.12; 357/67
[58] Field of Search ............ 357/23.1, 23.3, 23.12, 357/67, 23.8, 23.11, 12.9

[56] References Cited

U.S. PATENT DOCUMENTS

| 4,434,433 | 2/1984 | Nishizawa | 357/15 |
| 4,612,565 | 9/1986 | Shimizu et al. | 357/23.1 |

FOREIGN PATENT DOCUMENTS

| 100454 | 2/1984 | European Pat. Off. | 357/67 |
| 5165680 | 6/1979 | Japan | 357/67 |

OTHER PUBLICATIONS

Oka et al., "Two Dimensional . . . MOSFETS", IEEE IEDM, 1979, pp. 30-33.
Nishizawa, "A Limitation . . . Memories", (pp. 705-714), IEEE Journal of Solid State Circuits, vol. SC-15, No. 4, Aug. 1980.
Technical Digest of IEDM 84, pp. 642-646. E. P. Jacobs et al.; "N- and P-Well Process Compatibility in a 1 μm-CMOS Technology".
Technical Digest of IEDM 85, pp. 238-241, M. Nakahara et al., "Relief of Hot Carrier Constraint on Submicron CMOS Devices by Use of a Buried Channel Structure".

Primary Examiner—Martin H. Edlow
Attorney, Agent, or Firm—Foley & Lardner, Schwartz, Jeffery, Schwaab, Mack, Blumenthal & Evans

[57] ABSTRACT

A MOSFET utilizes a buried channel structure comprising a buried channel between a source electrode and a drain electrode. The device also comprises a gate electrode made of material whose Fermi level is located between a conduction band and a valency band of a semiconductor. An impurity concentration in the substrate is relatively high because of buried channel structure.

2 Claims, 4 Drawing Sheets

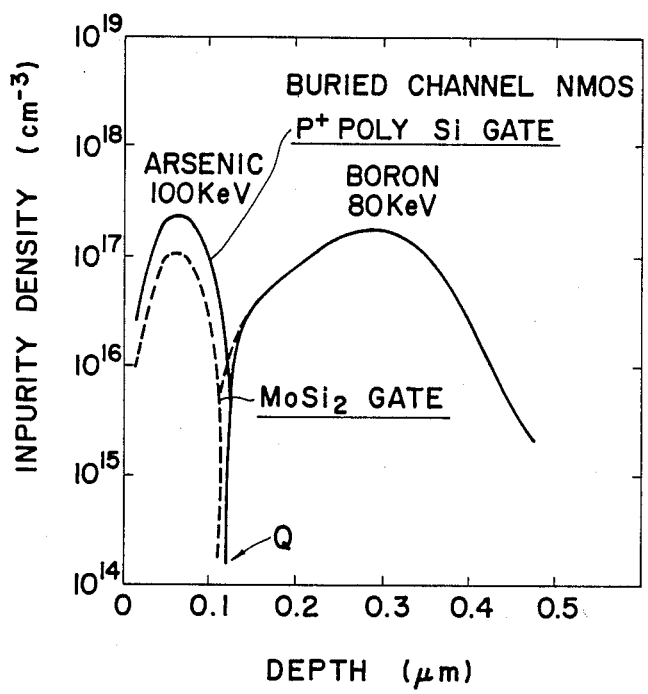
F I G. 3

FIELD-EFFECT TRANSISTOR DEVICES

BACKGROUND OF THE INVENTION

This invention relates to a field-effect transistor (FET) and, more particularly, to a metal-oxide semiconductor FET (MOSFET).

Nowadays a MOSFET is widely used and is required to have more highly integrated construction. A MOSFET, in general, comprises a semiconductor substrate, a source electrode and a drain electrode formed therein, which have a conductivity opposite to that of the substrate, a gate electrode, and a gate insulation layer formed between the substrate and the gate electrode. Hereinafter such a structure is referred to as a "typical structure". There is another structure providing a buried channel layer formed between the source and the drain electrodes having an opposite conductivity to that of the substrate. Hereinafter this structure is referred to as a "buried channel structure".

The most common material used for a gate electrode of a conventional MOSFET is polysilicon. Usually, phosphor or boron is diffused, at a high density, into the polysilicon so as to form a gate electrode made of N+ polysilicon or P+ polysilicon in order to lower the resistance of the gate electrode and make stable the work function thereof. Metals having a high melting point such as tungsten, molybdenum or silicide thereof are also well known materials for use as gate electrodes.

However, there are several drawbacks in the conventional MOSFET's using above-described materials. The drawbacks in a MOSFET using N+ polysilicon for a gate electrode will firstly be described. Since it is desired to set a threshold voltage at about 0.8V in an N-channel FET and at about −0.8V in a P-channel FET generally, the former adopts the typical structure and the latter adopts the buried channel structure. However, in the former, that is, in an N-channel FET, there is a defect of decreasing carrier mobility when circuit integration is conducted. The circuit integration makes an electric field in a channel increase and causes carriers to tend to move through a surface region of a substrate. Thus carrier mobility is decreased, so that operation speed and drive capability of the device are reduced. Further, many hot carriers are produced in the surface region of the substrate and these hot carriers are trapped in an insulation layer. The trapped hot carriers cause a change in electrical characteristics of the device. This change results in a decrease in the reliability of the device.

On the other hand, while a P-channel FET is less subject to the above-described defect because of its buried channel structure, it has the defect of decreasing a threshold voltage when circuit integration is made, because its channel length becomes short with integration (hereinafter this effect is referred to as "short channel effect").

Second, the drawbacks in a MOSFET using P+ polysilicon for a gate electrode are described. When P+ polysilicon is used for the gate electrode, buried channel structure is adopted to an N-channel FET and typical structure is adopted to a P-channel FET in order to set a threshold voltage at a designed value. Therefore, as described above, the defect caused by the short channel effect arises in the former and the defect of low carrier mobility and low reliability arises in the latter. In MOSFET's where metals having a high melting point such as tungsten, molybdenum or silicide thereof are used as the gate electrode, the following drawbacks still exist. In these MOSFET's, the density of impurities must be decreased in order to develop drive capability. Therefore, typical structure must be adopted to both N-channel FET's and P-channel FET's and it was found that drive capability and device reliability are lowered when circuit integration is made.

SUMMARY OF THE INVENTION

With the above in view, the present invention has been made and its object is to provide a novel MOSFET which has a high operation speed, a high carrier mobility, a high current drive capability, and a high reliability, even when circuit integration is made. In addition to that, the object of this invention is to prevent the threshold voltage of the MOSFET from decreasing by shortage of its channel length, that is, short channel effect.

The above described object is accomplished by providing a semiconductor device which comprises a semiconductor substrate of a first conductivity, a source electrode and a drain electrode of a second conductivity formed on the substrate, a buried channel of the first conductivity formed between the source and the drain electrodes, and a gate electrode formed above the channel through the intermediary of an insulation layer, the gate electrode being made of material whose Fermi level is located between a conduction band and a valency band of the semiconductor.

BRIEF DESCRIPTION OF THE DRAWINGS

In the accompanying drawings:

FIGS. 3 through 7 are graphs showing characteristics of the MOSFET's according to the invention and prior art.

DESCRIPTION OF THE PREFERRED EMBODIMENT

Figure 1:
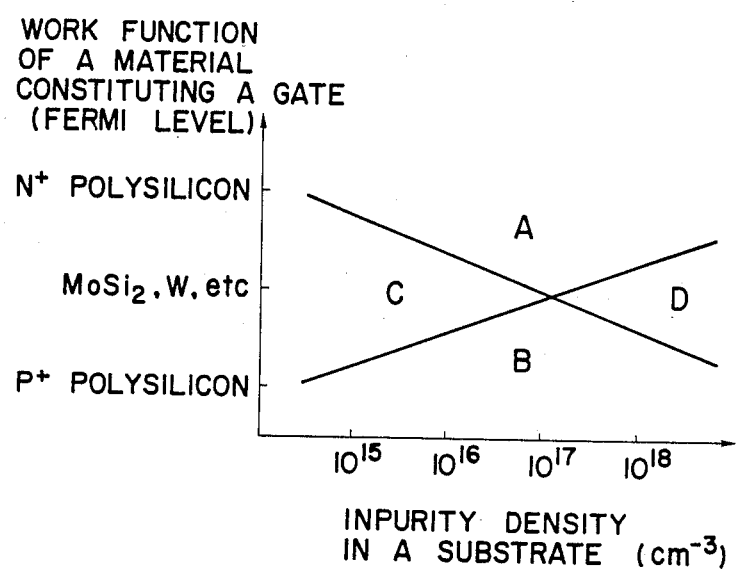
FIG. 1 is a classifying chart of MOSFET's based on materials constituting a substrate and a gate.

FIG. 1 shows a classification chart of MOSFET's, where the abscissa indicates an impurity density in a substrate and the ordinate indicates a work function or a Fermi level of a material constituting a gate electrode. In this chart, a region A contains conventional MOSFET's each having an N+ polysilicon gate electrode, where an N-channel one adopts the typical structure and a P-channel one adopts the buried channel structure as described before. A region B contains conventional MOSFET's each having a P+ polysilicon gate electrode, where an N-channel one adopts the buried channel structure and a P-channel one adopts the typical structure as also described before. A region C contains conventional MOSFET's each having a gate electrode which is constituted by metal having a high melting point such as tungsten, molybdenum or silicides thereof, where the Fermi level of these materials is located between those of an N+ polysilicon and a P+ polysilicon. In conventional MOSFET's belonging to the region C, an impurity density in a substrate tends to decrease so as to improve current drive capability. Therefore, both N-channel and P-channel MOSFET's in region C adopt the typical structure as described before.

The inventor discovered the fact that MOSFET's belonging to a region D are very useful for solving above described drawbacks associated with conventional devices, though such MOSFET's were previously regarded as useless. The present invention was derived from this discovery by the inventor. Thus a device according to the invention has the same kind of gate electrode as that of conventional MOSFET's in the region C, but an impurity density in the device is higher than that in the conventional MOSFET's. The device adopts the buried channel structure because of a high impurity density in a substrate. Therefore, the device has a higher mobility and a higher reliability than a device having a typical structure. Besides that, since the Fermi level of the gate material is located between those of N+ polysilicon and P+ polysilicon, the channel layer can be thinned so as to prevent short channel effect, that is, to prevent the threshold voltage of the device from decreasing.

Figure 2:
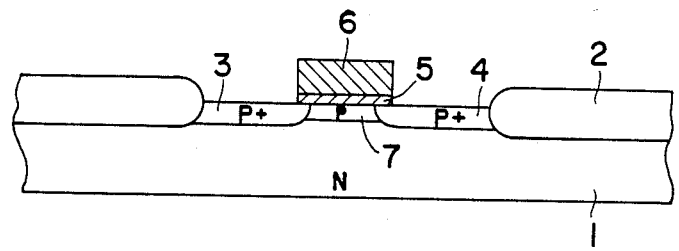
FIG. 2 is a cross sectional view showing an embodiment of a MOSFET device according to this invention.

Now, referring to the drawings, a preferred embodiment of the invention will be described in detail. FIG. 2 shows a cross-sectional view of a MOSFET device according to the invention. On a silicon substrate 1, a field oxide 2 is formed which surrounds a device region. In the device region, a source electrode 3 and a drain electrode 4 having a conductivity opposite to the substrate 1 are formed, and therebetween a channel forming 7, which also has a conductivity opposite to the substrate 1, is formed. Above the substrate 1, a gate electrode 6 is formed with an insulation layer 5 interposed therebetween.

The first characterizing feature of the device is that the device adopts the buried channel structure, and the second characterizing feature is that the gate electrode 6 is made of metals having a high melting point such as tungsten, molybdenum or silicide thereof, these materials having a Fermi level located between those of N+ polysilicon and P+ polysilicon. Owing to the first feature, that is, use of the buried channel structure, a mobility is improved over a device having typical structure. Owing to the second feature, that is, use of a specific material for the gate electrode, it is possible to obtain a desired threshold value even if the channel forming region 7 is formed to be shallow. When the superficial channel can be formed the mobility is improved. Therefore, an operation speed and current drive capability of the device can be improved. Besides, the shallow channel prevents the short channel effect.

For a gate material, Mo, W, $MoSi_2$, $WSi_2$, etc. are used. Polysilicon containing no impurities is also used. When $MoSi_2$ is used for the gate electrode of a CMOSFET having a threshold voltage of +0.8V, it is preferred to make an impurity density in the substrate higher than $1 \times 10^{17}$ cm$^{-3}$ at a peak value. In this condition, buried channel structure can be adopted by both N-channel and P-channel transistors. Since the threshold value slightly depends on the thickness of an insulation layer, in the buried channel structure device, the thickness of the layer is not critical.

FIG. 3 shows the distribution of impurities in a substrate from the surface toward the inside measured for a buried channel NMOSFET according to the prior art which has a P+ polysilicon gate electrode (shown by a solid line), and according to this invention, which has a $MoSi_2$ gate electrode (shown by a broken line). As shown in the graph, a PN junction point Q is located in a shallower position in the device according to the invention than that of the prior art. This means that the device according to the invention has a shallow channel.

Figure 4:
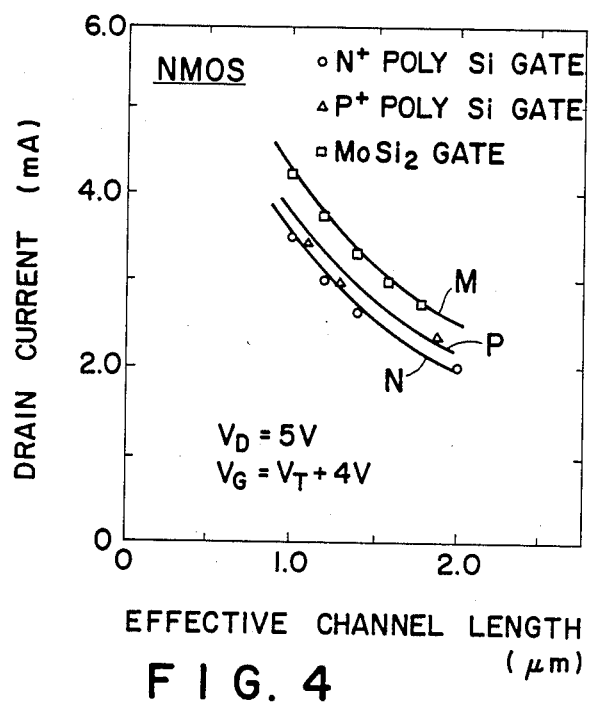
Figure 5:
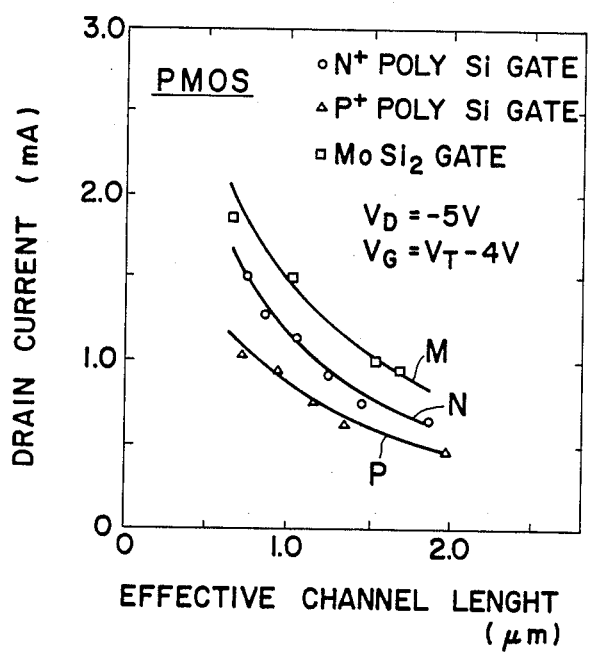

FIGS. 4 and 5 are graphs showing relations between an effective channel length and a drain current in an NMOSFET and a PMOSFET, respectively. In the graphs, a curve M shows a characteristic of a device having a $MoSi_2$ gate electrode according to the invention, and curves P and N which show the characteristics of devices having a conventional P+ polysilicon gate electrode and a conventional N+ polysilicon gate electrode, respectively, according to the prior art. These graphs clearly show that the device according to the invention has larger current drive capability than the devices of the prior art.

Figure 6:
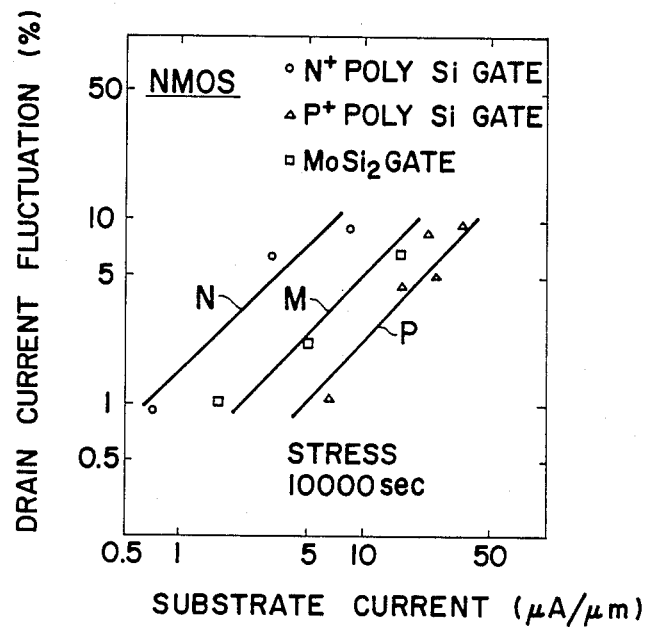

FIG. 6 shows a fluctuation of a drain current caused by a substrate current. Increase in the fluctuation of the drain current reduces reliability of the device. This graph indicates that the device according to the invention has higher reliability than the prior art device having an N+ polysilicon gate electrode though it has less reliability than the prior art device having a P+ polysilicon gate electrode.

Figure 7:
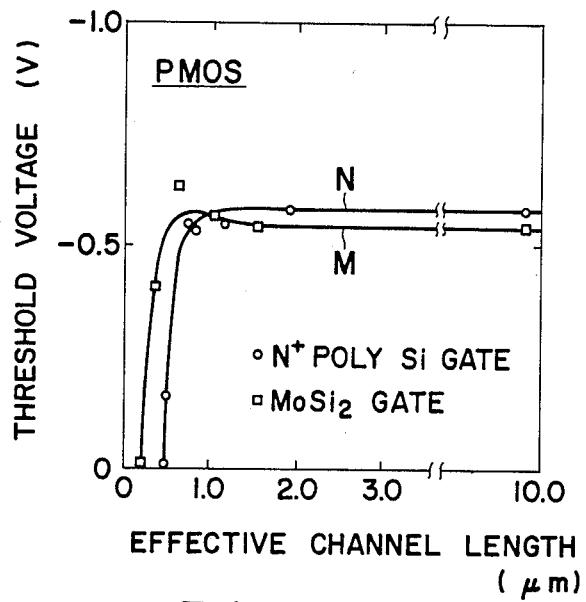

FIG. 7 shows a relation between an effective channel length and a threshold voltage. A threshold voltage keeps a high level until an effective channel length rapidly decreases. As shown in the graph, the knee point of the curve M, which corresponds to the device according to the invention, is located to the left of that of curve N, which corresponds to the prior device. Thus, the invention prevents the short channel effect associated with devices of the prior art.

In conclusion, since a MOSFET according to the invention adopts the buried channel structure and has a gate electrode made of materials having an intermediate Fermi level, the following improvement can be attained.

(i) A high mobility can be obtained even if a high integration is carried out so as to improve the operation speed and current drive capability.

(ii) A threshold voltage can be kept at a high value by preventing the short channel effect.

What is claimed is:

1. In an insulated gate semiconductor device comprising a semiconductor substrate having a first conductivity, a source electrode and a drain electrode having a second conductivity and formed on the substrate, a buried channel having said first conductivity and formed between the source electrode and the drain electrode, and a gate electrode formed above the channel through the intermediary of an insulation layer, the improvement wherein said gate electrode is made of material having a Fermi level located between a conduction band and a valence band of the semiconductor, and wherein the substrate has an impurity concentration of more than $1 \times 10^{17}$ cm$^{-3}$.

2. A semi-conductor device according to claim 1, wherein the gate electrode is made of tungsten, molybdenum or silicides thereof.

* * * * *